United States Patent

Davies et al.

[11] Patent Number: 5,886,921
[45] Date of Patent: Mar. 23, 1999

[54] STATIC RANDOM ACCESS MEMORY CELL HAVING GRADED CHANNEL METAL OXIDE SEMICONDUCTOR TRANSISTORS AND METHOD OF OPERATION

[75] Inventors: Robert B. Davies, Tempe; James S. Caravella, Chandler; Andreas A. Wild, Scottsdale; Merit Y. Hong, Chandler, all of Ariz.

[73] Assignee: Motorola, Inc., Schaumburg, Ill.

[21] Appl. No.: 762,171

[22] Filed: Dec. 9, 1996

[51] Int. Cl.⁶ ................................................... G11C 11/00
[52] U.S. Cl. ............................................ 365/154; 365/156
[58] Field of Search ................................... 365/154, 156; 257/384; 437/44

[56] References Cited

U.S. PATENT DOCUMENTS

| | | | |
|---|---|---|---|
| 4,070,655 | 1/1978 | Schriimeyer et al. | 365/156 |
| 4,175,290 | 11/1979 | Harari | 365/156 |
| 4,780,751 | 10/1988 | Nishimoto | 365/154 |
| 5,132,771 | 7/1992 | Yamanaka et al. | 365/154 |
| 5,162,884 | 11/1992 | Liou et al. | 257/384 |
| 5,687,355 | 11/1997 | Joardar et al. | 395/500 |
| 5,716,866 | 2/1998 | Dow et al. | 437/44 |

OTHER PUBLICATIONS

"Field Effect–Transistor With Asymmetrical Structure", Codella et al., United States Statutory Invention Registration No. H986, Published Nov. 5, 1991, U.S. Class 437, Subclass 41, Application Filing Date Jun. 9, 1989.

*Primary Examiner*—David Nelms
*Assistant Examiner*—Trong Phan
*Attorney, Agent, or Firm*—Rennie William Dover; Robert D. Atkins

[57] ABSTRACT

An SRAM memory cell (40) uses GCMOS transistors (42, 44, 56, and 58) for improving discharge of complementary bit lines (60 and 62). The GCMOS transistors (42, 44, 56, and 58) have a graded-channel region on only the source side of the transistors. Configuring the pass-transistors (56 and 58) having the drain terminals connected to the complementary bit lines (60 and 62) and the cross-coupled transistors (42 and 44) having drain terminals connected to the memory cell outputs improves timing for a read operation of the memory cell (40).

12 Claims, 1 Drawing Sheet

STATIC RANDOM ACCESS MEMORY CELL HAVING GRADED CHANNEL METAL OXIDE SEMICONDUCTOR TRANSISTORS AND METHOD OF OPERATION

BACKGROUND OF THE INVENTION

The present invention relates, in general, to integrated circuits and, more particularly, to field effect transistor memories.

Static memory cells typically have cross-coupled transistors combined with load devices to provide data storage. The memory cell includes pass-transistors controlled by a word line for either writing data to the memory cell for storage or reading the stored data for transfer to complementary bit lines.

The length of the complementary bit lines depends on the configuration of the memory array. Long complementary bit lines have large parasitic capacitance which slows the read operation from the memory cell. Because the transistors of the memory cells are small, they are unable to charge and discharge the parasitic capacitance of the complementary bit lines in a timely fashion.

Accordingly, a need exists for improving the speed of reading data stored in a memory cell. Further, it would be advantageous to improve the speed of the read operation without increasing the size of the memory cell.

DETAILED DESCRIPTION OF THE DRAWINGS

Generally, the present invention provides an improved memory cell using unilateral, graded-channel field effect transistors. A gate electrode is provided overlying a semiconductor substrate and a graded-channel region is formed in the semiconductor substrate. The transistors are described as "unilateral" because the graded-channel region is only formed on the source sides of the transistors. The graded-channel transistors provide several advantages including higher carrier mobility, lower body effect, higher punch-through resistance, and lower sensitivity to gate length. The graded-channel region provides the field effect transistors with asymmetric current driving capabilities that improve the speed of the read operation.

Figure 1:
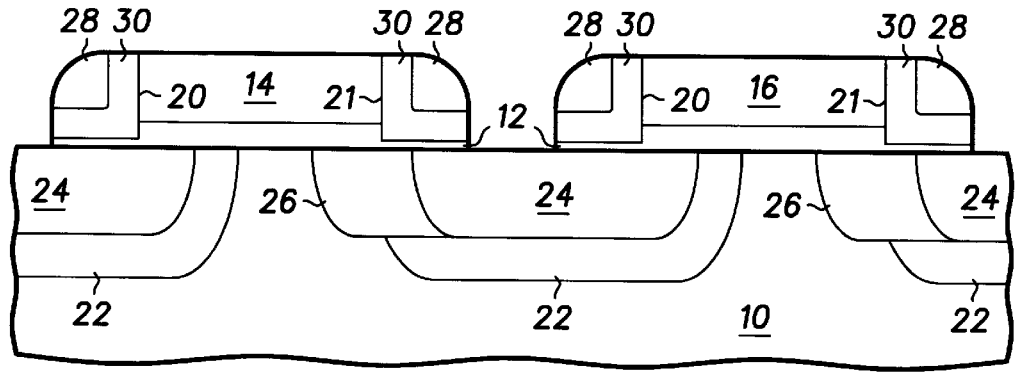
FIG. 1 is a cross-sectional view of a unilateral, graded-channel IGFET.

FIG. 1 is a cross-sectional view of a unilateral, graded-channel insulated gate field effect transistor (IGFET). It should be noted that the unilateral, graded-channel IGFET is also referred to as a graded-channel metal oxide semiconductor (GCMOS) transistor. By way of example, N-channel enhancement-mode devices are described herein, but those skilled in the art will readily recognize that substitutions of dopant types, materials and processes can be made to the following described method while remaining within the scope of the present invention. For example, P-channel devices can also be formed using the present invention with appropriate changes in dopant conductivity types.

A semiconductor substrate 10 is provided and lightly-doped to have a P-type conductivity. An insulating layer 12 is formed on substrate 10 and polysilicon gate electrodes 14 and 16 are formed on insulating layer 12. As is known, etching of polysilicon to form electrodes 14 and 16 typically thins insulating layer 12 in the regions between electrodes 14 and 16. Gate electrodes 14 and 16 have sidewalls 20 and 21.

Graded-channel regions 22 are formed in substrate 10. Doped regions 22 have the same conductivity type as substrate 10, which is P-type in this example. Doped regions 22 are substantially aligned to sidewalls 20 on the source side of each device.

Extension regions 26 are formed substantially aligned to sidewalls 21 of gate electrodes 14 and 16 on the drain side of each device. Extension regions 26 are disposed adjoining doped regions 24 on the drain sides of each device. Dielectric spacers 28 and dielectric layers 30 are formed using conventional techniques.

Conventional silicide layers (not shown) are preferably formed over source/drain doped regions 24 and gate electrodes 14 and 16. Finally, conventional processing is used to provide contacts (not shown) to doped regions 24 and to complete the devices.

Figure 2:
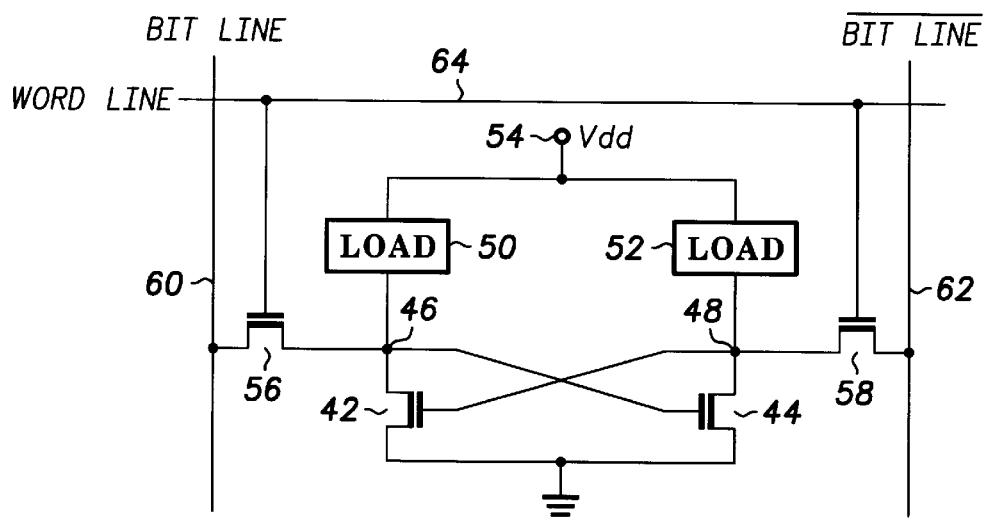
FIG. 2 is a schematic diagram of a four transistor memory cell in accordance with the present invention.

FIG. 2 is a schematic diagram of a four transistor memory cell 40 in accordance with the present invention. Transistors 42, 44, 56, and 58 are N-channel GCMOS transistors having device structures such as those shown in FIG. 1. Transistors 42 and 44 are configured having cross-coupled gates. In particular, a gate terminal of transistor 42 is connected to a drain terminal of transistor 44 and a gate terminal of transistor 44 is connected to a drain terminal of transistor 42. The commonly connected source terminals of transistors 42 and 44 serve as a bias terminal and are connected to a source of operating potential such as, for example, a ground potential.

The commonly connected first terminals of loads 50 and 52 serve as a bias terminal 54 and are connected to a source of operating potential such as, for example, a voltage $V_{DD}$. Loads 50 and 52 can be PN-junction diodes, diode-connected field effect transistors (FETs), resistors, or the like. The common connection of the drain terminal of transistor 42 with a second terminal of load 50 forms a node 46. The common connection of the drain terminal of transistor 44 with a second terminal of load 52 forms a node 48.

N-type transistors 56 and 58 are pass-transistors. In particular, transistors 56 and 58 have commonly connected gate terminals which in turn are connected to word line 64. The drain terminal of transistor 56 is connected to bit line 60 (BITLINE) and the source terminal of transistor 56 is connected to node 46. The drain terminal of transistor 58 is connected to complementary bit line 62 ($\overline{\text{BITLINE}}$) and the source terminal of transistor 58 is connected to node 48.

In operation, the GCMOS transistor is not symmetrical when comparing the current conducted from the source to the drain terminal with the current conducted from the drain to the source terminal. In other words, a GCMOS transistor has differing current carrying characteristics corresponding to the direction of the current conduction between the source and drain terminals. For instance, transistors 42 and 44 have a higher transconductance when the graded-channel region formed on the source side of the transistors is connected to ground potential and the drain terminals are connected to nodes 46 and 48, respectively.

By way of example, memory cell 40 stores a zero value when transistor 44 is "off" and transistor 42 is "on". It should be noted that memory cell 40 stores a zero value in the write mode in response to a logic zero value on bit line 60 and a logic one value on complementary bit line 62. GCMOS transistors 42 and 44 are configured such that the drain terminals are connected to nodes 46 and 48, respectively. Pass-transistors 56 and 58 are configured such that the drain terminals are connected to bit lines 60 and 62, respectively. The graded-channel region is formed on the source side of transistors 42, 44, 56 and 58.

In a read mode with bit line 60 and complementary bit line 62 precharged to a logic one value, the zero value stored in memory cell 40 is output from node 46 onto bit line 60 and the complementary logic value is output from node 48 onto complementary bit line 62. The asymmetric current carrying capabilities of GCMOS transistor 42 and GCMOS pass-transistor 56 cooperate to discharge bit line 60 through a low resistance path. In other words, both transistors 42 and 56 are configured through source/drain terminal connections to provide a higher current discharge path compared to either transistor 42 or 56 having opposite source/drain terminal connections.

In a read mode where transistor 44 is "on", the asymmetric current carrying capabilities of GCMOS transistor 44 and GCMOS pass-transistor 58 cooperate to discharge complementary bit line 62 through a low resistance path. In other words, both transistors 44 and 58 are configured through source/drain terminal connections to provide a higher current discharge path compared to either transistor 44 or 58 having opposite source/drain terminal connections.

Figure 3:
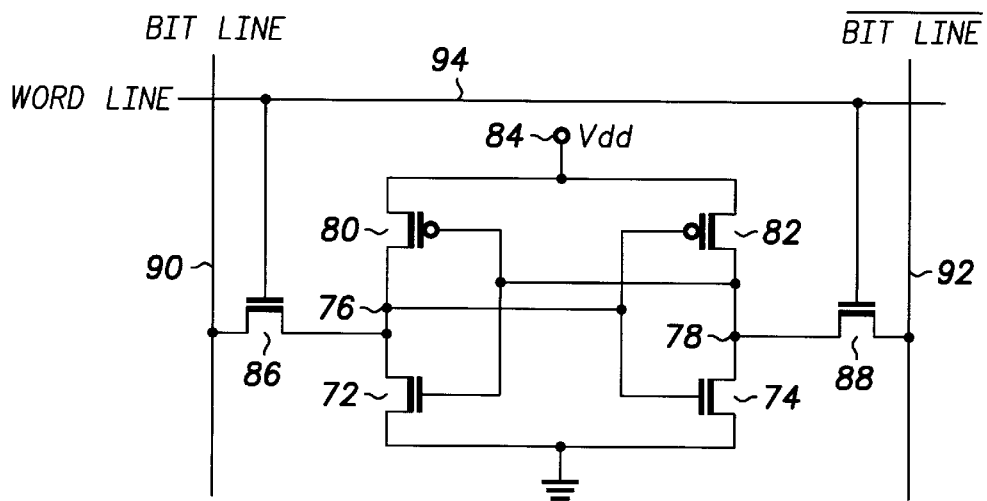
FIG. 3 is a schematic diagram of a six transistor memory cell in accordance with the present invention.

FIG. 3 is a schematic diagram of a six transistor memory cell 70 in accordance with the present invention. Transistors 72, 74, 86, and 88 are N-type GCMOS transistors having device structures such as those shown in FIG. 1. Transistors 72 and 74 are configured having cross-coupled gates. In particular, a gate terminal of transistor 72 is connected to a drain terminal of transistor 74 and a gate terminal of transistor 74 is connected to a drain terminal of transistor 72. The commonly connected source terminals of transistors 72 and 74 serve as a bias terminal and are connected to a source of operating potential such as, for example, a ground potential.

P-type transistors 80 and 82 are load transistors. The commonly connected drain terminals of transistors 80 and 82 serve as a bias terminal 84 and are connected to a source of operating potential such as, for example, a voltage $V_{DD}$. The common connection of the drain terminal of transistor 72 with the source terminal of transistor 80 forms a node 76. The commonly connected gate terminals of transistors 74 and 82 are connected to node 76. The common connection of the drain terminal of transistor 74 with the source terminal of transistor 82 forms a node 78. The commonly connected gate terminals of transistors 72 and 80 are connected to node 78.

N-channel transistors 86 and 88 are pass-transistors. In particular, transistors 86 and 88 have commonly connected gate terminals connected to word line 94 (WORD LINE). The drain terminal of transistor 86 is connected to bit line 90 (BITLINE) and the source terminal of transistor 86 is connected node 76. The drain terminal of transistor 88 is connected to complementary bit line 92 ($\overline{BITLINE}$) and the source terminal of transistor 88 is connected to node 78.

In operation, the asymmetric current carrying capabilities of GCMOS transistor 72 and pass-transistor 86 cooperate to discharge bit line 90 through a low resistance path in a read mode. In other words, both transistors 72 and 86 are configured through source/drain terminal connections to provide a higher current discharge path compared to either transistor 72 or 86 having opposite source/drain terminal connections.

P-channel transistors 80 and 82 can be either unilateral GCMOS transistors or symmetrical bi-directional MOSFETs configured to have drain terminals connected at nodes 76 and 78, respectively. The conventional P-channel transistor, i.e., a symmetrical bi-directional MOSFET, has a lower gain and transconductance than a GCMOS transistor, resulting in a lower current load for comparable device sizes. The configuration whereby drain terminals are connected at the output nodes 76 and 78 provides memory cell 70 with minimal leakage properties. The configuration whereby drain terminals are connected at terminal 84 to voltage reference $V_{DD}$ provides memory cell 70 with optimal speed properties.

The configuration of the source and drain terminals for pass-transistors 86 and 88 can be modified in another embodiment so that the source terminals are connected to the complementary bit lines. In this configuration, the drain terminals of pass-transistors 86 and 88 are connected to nodes 76 and 78, respectively. The speed for a write operation is enhanced with the pass-transistors in this modified configuration.

By now it should be appreciated that there has been provided a static random access memory (SRAM) cell using graded-channel transistors to improve cell data read time.

We claim:

1. A static random access memory, comprising:
   a first unilateral GCMOS transistor having a gate terminal, a drain terminal, a source terminal, and a graded-channel region adjacent the source terminal;
   a second unilateral GCMOS transistor having a gate terminal, a drain terminal, a source terminal, and a graded-channel region adjacent the source terminal, wherein the gate terminal is coupled to the drain terminal of the first unilateral GCMOS transistor and the drain terminal is coupled to the gate terminal of the first unilateral GCMOS transistor;
   a third unilateral GCMOS transistor having a gate terminal, a drain terminal, a source terminal, and a graded-channel region adjacent the source terminal, wherein the gate terminal is coupled to a word line, the drain terminal is coupled to a bit line, and the source terminal is coupled to the drain terminal of the first unilateral GCMOS transistor;
   a fourth unilateral GCMOS transistor having a gate terminal, a drain terminal, a source terminal, and a graded-channel region adjacent the source terminal, wherein the gate terminal is coupled to the word line, the drain terminal is coupled to a complementary bit line, and the source terminal is coupled to the drain terminal of the second unilateral GCMOS transistor;
   a first load having a terminal coupled to the drain terminal of the first unilateral GCMOS transistor; and
   a second load having a terminal coupled to the drain terminal of the second unilateral GCMOS transistor.

2. The static random access memory of claim 1, wherein the first load and the second load are resistors.

3. The static random access memory of claim 1, wherein the first load and the second load are diode-connected field effect transistors.

4. The static random access memory of claim 1, wherein the first unilateral GCMOS transistor, the second unilateral GCMOS transistor, the third unilateral GCMOS transistor, and the fourth unilateral GCMOS transistor are N-channel enhancement-mode devices.

5. A memory cell, comprising:
   a first unilateral GCMOS transistor of a first type having a gate terminal, a drain terminal, a source terminal, and a graded-channel region adjacent the source terminal, wherein the source terminal is coupled to a first supply terminal;

a second unilateral GCMOS transistor of the first type having a gate terminal, a drain terminal, a source terminal, and a graded-channel region adjacent the source terminal, wherein the gate terminal is coupled to the drain terminal of the first unilateral GCMOS transistor, the drain terminal is coupled to the gate terminal of the first unilateral GCMOS transistor, and the source terminal is coupled to the first supply terminal;

a third unilateral GCMOS transistor of the first type having a gate terminal, a drain terminal, a source terminal, and a graded-channel region adjacent the source terminal, wherein the gate terminal is coupled to a word line, the drain terminal is coupled to a bit line, and the source terminal is coupled to the drain terminal of the first unilateral GCMOS transistor;

a fourth unilateral GCMOS transistor of the first type having a gate terminal, a drain terminal, a source terminal, and a graded-channel region adjacent the source terminal, wherein the gate terminal is coupled to the word line, the drain terminal is coupled to a complementary bit line, and the source terminal is coupled to the drain terminal of the second unilateral GCMOS transistor;

a first transistor of a second type having a gate terminal, a drain terminal, and a source terminal, wherein the gate terminal is coupled to the gate terminal of the first unilateral GCMOS transistor; and a second transistor of the second type having a gate terminal, a drain terminal, and a source terminal, wherein the gate terminal is coupled to the gate terminal of the second unilateral GCMOS transistor.

6. The memory cell of claim 5, wherein the first transistor of the second type and the second transistor of the second type are symmetrical bi-directional MOSFETs.

7. The memory cell of claim 6, wherein the source terminal of the first transistor of the second type is coupled to the source terminal of the second transistor of the second type, the drain terminal of the first transistor of the second type is coupled to the drain terminal of the first unilateral GCMOS transistor, and the drain terminal of the second transistor of the second type is coupled to the drain terminal of the second unilateral GCMOS transistor.

8. The memory cell of claim 5, wherein the first transistor of the second type and the second transistor of the second type are asymmetrical GCMOS MOSFETs, both asymmetrical GCMOS MOSFETs further comprising a graded-channel region adjacent the source.

9. The memory cell of claim 8, wherein the source terminal of the first transistor of the second type is coupled to the source terminal of the second transistor of the second type, the drain terminal of the first transistor of the second type is coupled to the drain terminal of the first unilateral GCMOS transistor, and the drain terminal of the second transistor of the second type is coupled to the drain terminal of the second unilateral GCMOS transistor.

10. The memory cell of claim 8, wherein the drain terminal of the first transistor of the second type is coupled to the drain terminal of the second transistor of the second type, the source terminal of the first transistor of the second type is coupled to the drain terminal of the first unilateral GCMOS transistor, and the source terminal of the second transistor of the second type is coupled to the drain terminal of the second unilateral GCMOS transistor.

11. A memory cell, comprising:

a first unilateral GCMOS transistor of a first type having a gate terminal, a drain terminal, a source terminal, and a graded-channel region adjacent the source terminal, wherein the source terminal is coupled to a first supply terminal;

a second unilateral GCMOS transistor of the first type having a gate terminal, a drain terminal, a source terminal, and a graded-channel region adjacent the source terminal, wherein the gate terminal is coupled to the drain terminal of the first unilateral GCMOS transistor, the drain terminal is coupled to the gate terminal of the first unilateral GCMOS transistor, and the source terminal is coupled to the first supply terminal;

a third unilateral GCMOS transistor of the first type having a gate terminal, a drain terminal, a source terminal, and a graded-channel region adjacent the source terminal, wherein the gate terminal is coupled to a word line, the source terminal is coupled to a bit line, and the drain terminal is coupled to the drain terminal of the first unilateral GCMOS transistor;

a fourth unilateral GCMOS transistor of the first type having a gate terminal, a drain terminal, a source terminal, and a graded-channel region adjacent the source terminal, wherein the gate terminal is coupled to the word line, the source terminal is coupled to a complementary bit line, and the drain terminal is coupled to the drain terminal of the second unilateral GCMOS transistor;

a first transistor of a second type having a gate terminal, a drain terminal, and a source terminal, wherein the gate terminal is coupled to the gate terminal of the first unilateral GCMOS transistor; and a second transistor of the second type having a gate terminal, a drain terminal, and a source terminal, wherein the gate terminal is coupled to the gate terminal of the second unilateral GCMOS transistor.

12. A method for discharging complementary bit lines in a memory cell, comprising the steps of:

configuring two cross-coupled unilateral GCMOS transistors with a graded-channel region as the source terminal connected to a ground potential;

configuring a first unilateral GCMOS pass-transistor having a drain terminal connected to a bit line and a source terminal connected to a drain terminal of one of the two cross-coupled unilateral GCMOS transistors, wherein a graded-channel region of the first unilateral GCMOS pass-transistor is adjacent the source terminal;

configuring a second unilateral GCMOS pass-transistor with a drain terminal connected to a complementary bit line and a source terminal connected to a drain terminal of the other one of the two cross-coupled unilateral GCMOS transistors, wherein a graded-channel region of the second unilateral GCMOS pass-transistor is adjacent the source terminal;

applying a logic value to a word line to turn the first and second unilateral GCMOS pass-transistors "on"; and discharging one of the complementary bit lines.

* * * * *